US007517710B2

(12) United States Patent
Choi et al.

(10) Patent No.: US 7,517,710 B2
(45) Date of Patent: Apr. 14, 2009

(54) METHOD OF MANUFACTURING FIELD EMISSION DEVICE

(75) Inventors: Jun-Hee Choi, Seongnam-si (KR); Ho-Suk Kang, Seoul (KR); Chan-Wook Baik, Seongnam-si (KR); Ha-Jong Kim, Yongin-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 169 days.

(21) Appl. No.: 11/604,731

(22) Filed: Nov. 28, 2006

(65) Prior Publication Data

US 2007/0176206 A1 Aug. 2, 2007

(30) Foreign Application Priority Data

Feb. 2, 2006 (KR) ..................... 10-2006-0010057

(51) Int. Cl.
*H01L 21/00* (2006.01)
*H01L 29/06* (2006.01)

(52) U.S. Cl. ............................ 438/34; 438/29; 438/40; 438/43; 438/701; 438/713; 438/723; 438/724; 438/737; 438/739; 438/740; 438/743; 438/744; 438/751; 257/10; 257/89; 257/E27.12; 257/E21.527; 313/495

(58) Field of Classification Search .................. 438/22, 438/29, 34, 39, 40, 43, 701, 713, 723, 724, 438/737, 739, 740, 743, 744, 751, 756, 757; 257/10, 89, 306, E27.12, E21.527; 313/495
See application file for complete search history.

(56) References Cited

U.S. PATENT DOCUMENTS

2003/0015958 A1* 1/2003 Saito et al. .................. 313/495
2004/0080260 A1* 4/2004 Park et al. .................. 313/495
2005/0023959 A1* 2/2005 Rasmussen ................ 313/496
2005/0026532 A1* 2/2005 Hu ............................ 445/50
2005/0029922 A1* 2/2005 Taniguchi et al. ........... 313/495
2005/0127814 A1* 6/2005 Deguchi et al. ............. 313/495
2005/0206634 A1* 9/2005 Hamamoto et al. ......... 345/204
2005/0236963 A1* 10/2005 Kang et al. ................. 313/495
2005/0253068 A1* 11/2005 Ito et al. ..................... 250/310
2005/0276096 A1* 12/2005 Hara et al. .................. 365/158

* cited by examiner

*Primary Examiner*—Thanh V Pham
(74) *Attorney, Agent, or Firm*—Robert E. Bushnell, Esq.

(57) ABSTRACT

A method of manufacturing a field emission device (FED), which reduces the number of photomask patterning processes and improves the manufacturing yield of the FED, is provided. The method includes steps of sequentially forming a cathode layer, a first insulating layer, and a gate layer on a substrate, forming a protection layer on the gate electrode layer, etching portions of the protection layer and gate electrode to form a plurality of first opening holes where portions of the first insulating layer being exposed through the first opening holes, forming a second insulating layer on the protection layer and on the first opening holes, forming a focus electrode layer on the second insulating layer, forming a photoresist layer on the focus electrode layer, etching a portion of the photoresist layer and a portion of the focus electrode layer to form a second opening hole where a portion of the second insulating layer being exposed through the second opening hole, and forming emitter holes exposing a portion of the cathode layer by etching the exposed surface of the second insulating layer to a bottom surface of the first insulating layer. After removing the photoresist layer electron emission emitters are formed on the cathode layer.

19 Claims, 10 Drawing Sheets

METHOD OF MANUFACTURING FIELD EMISSION DEVICE

CLAIM OF PRIORITY

This application makes reference to, incorporates the same herein, and claims all benefits accruing under 35 U.S.C. § 119 from an application for METHOD OF MANUFACTURING FIELD EMISSION DEVICE earlier filed in the Korean Intellectual Property Office on 2 Feb. 2006 and there duly assigned Ser. No. 10-2006-0010057.

BACKGROUND OF THE INVENTION

1. Field of the Invention

The present invention relates to a field emission device (FED), and more particularly, to a method of manufacturing an FED in which the number of photomask patterning processes is small and an emitter hole forming process can be precisely controlled to improve the manufacturing yield of the FED.

2. Description of the Related Art

A field emission device (FED) is a color image display that realizes a color image by applying an electric field to an emitter formed on an electrode to emit an electron beam from the emitter onto a phosphor material.

The core technology of a FED lies in the manufacturing techniques of an emitter tip from which electrons are emitted, and in the stability of the emitter tip. In a FED, a silicon tip or a molybdenum tip has been used as an emitter tip, but since silicon and molybdenum tips have short lifetimes and low stability, the electron emission efficiency thereof is low. Thus, carbon nanotubes that have excellent electron emission efficiency have been commonly used as emitters for FEDs. Due to their wide viewing angles, high resolution, low power consumption, and excellent temperature stability, FEDs can be used in various applications such as car navigation devices and view finders of electronic imaging devices. FEDs particularly have advantages for alternative displays of personal data assistants (PDAs), medical devices, high definition televisions (HDTVs), etc.

A FED includes a plurality of emitter arrays, and each emitter can be installed in an emitter hole. Accordingly, a FED manufacturing process necessarily includes an emitter hole patterning process to install the emitters in the holes, and a very precise photolithography process is required to make patterns of fine emitter holes. In detail, a FED manufacturing process requires a photolithography process having at least two steps. However, when emitter holes are manufactured in a plurality of photolithography processes, the FED manufacturing process becomes complicated and the manufacturing cost increases. Furthermore, a fine emitter hole with a diameter of 15 μm or less is difficult to realize with a large number of photolithography processes, and thus the manufacturing yield of FEDs can be reduced.

SUMMARY OF THE INVENTION

The present invention provides a method of manufacturing a field emission device (FED) that has a small number of photomask patterning processes. In the method, emitter hole formation can be precisely controlled to increase the manufacturing yield of the FED.

According to an aspect of the present invention, there is provided a method of manufacturing of a field emission device (FED) that includes steps of sequentially forming a cathode layer, a first insulating layer, and a gate electrode layer on a substrate, forming a protection layer on the gate electrode layer, and etching portions of the protection layer and portions of the gate electrode layer to form a plurality of first opening holes. Portions of the first insulating layer are exposed through the first opening holes.

The method of manufacturing of the FED further includes steps of forming a second insulating layer on the protection layer and on the first opening holes, forming a focus electrode layer on the second insulating layer, forming a photoresist layer on the focus electrode layer, and etching a portion of the photoresist layer and a portion of the focus electrode layer to form a second opening hole. Both of the portion of the photoresist layer and the portion of the focus electrode layer, which are to be etched, are the portions that cover the first opening holes. A portion of the second insulating layer is exposed through the second opening hole.

The method of manufacturing of the FED further includes a step of etching the exposed portion of the second insulating layer and the portions of the first insulating layer that is exposed through the first opening holes to form emitter holes. Portions of the cathode layer are exposed through the emitter holes. At the final step electron emission emitters are formed on the exposed surface of the cathode layer.

The step of etching the exposed portion of the second insulating layer and the portions of the first insulating layer includes steps of undercut-etching the exposed portion of the second insulating layer, and undercut-etching the portions of the first insulating layer that is exposed through the first opening holes. As the results of the steps of undercut-etching, protrusions of the focus electrode layer protruding into the emitter holes, protrusions of the gate electrode layer protruding into the emitter holes, and protrusions of the protection layer protruding into the emitter holes are made.

The step of etching the exposed portion of the second insulating layer and the portions of the first insulating layer further includes steps of removing the protrusions of the focus electrode layer, removing the protrusions of the gate electrode layer, and removing protrusions of the protection layer. The step of removing protrusions of the focus electrode layer and the step of removing protrusions of the gate electrode layer can be performed at the same time. The steps of removing the protrusions of the focus electrode layer, removing the protrusions of the gate electrode layer, and removing the protrusions of the protection layer can be performed in wet-etching processes.

Each of the gate electrode layer, the protection layer, and the focus electrode layer can be made of a material such as chromium (Cr), aluminum (Al), molybdenum (Mo), silver (Ag), copper (Cu), gold (Au), or alloys thereof. The gate electrode layer and the protection layer can be made of different materials that have different etching selectivity.

The first and second insulating layers may be made of silicon oxide or silicon nitride. The silicon oxide may be $SiO_X$, where x is less than 2, and the silicon nitride is $Si_3N_4$. The electron emission emitter may be formed of a carbon nanotube material. According to the present invention, an FED with a fine emitter pattern having a uniform size of 15 μm or less can be obtained.

BRIEF DESCRIPTION OF THE DRAWINGS

A more complete appreciation of the invention and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
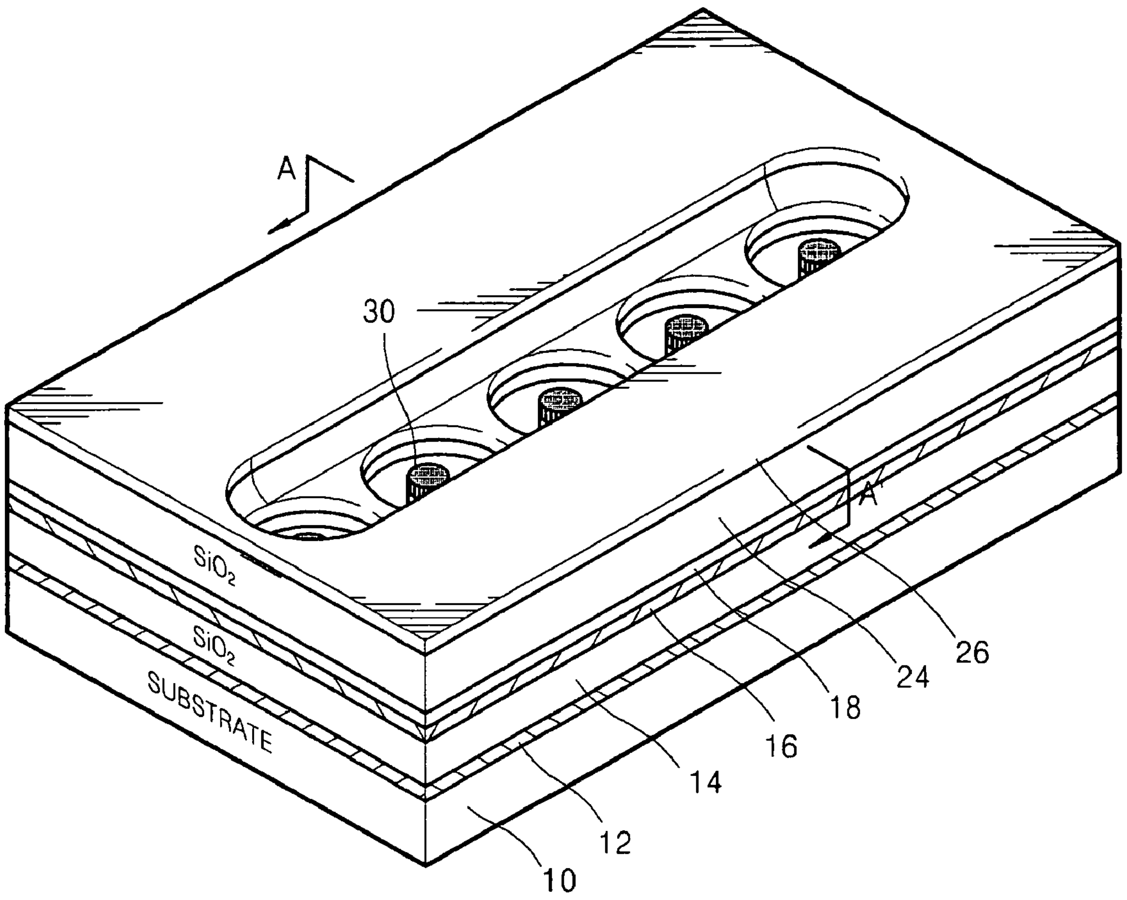
FIG. 1 is a perspective view of a field emission device (FED) manufactured according to a method built as an embodiment of the present invention.

The present invention will now be described more completely with reference to the accompanying drawings, in which exemplary embodiments of the invention are shown. In the drawings, the thicknesses of layers and regions are exaggerated for clarity.

Figure 2:
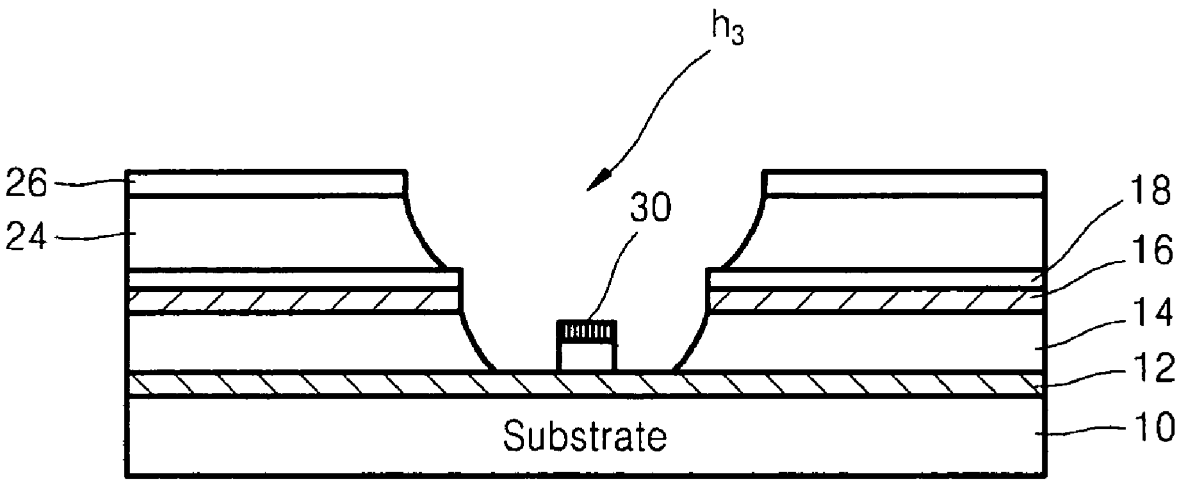
FIG. 2 is a cross-sectional view of the FED of FIG. 1 cut along a line A-A'.

FIG. 1 is a perspective view of a field emission device (FED) manufactured as an embodiment of the present invention. FIG. 2 is a cross-sectional view of the FED of FIG. 1 cut along a line A-A'. Referring to FIGS. 1 and 2, a plurality of emitter holes $h_3$ are arranged in a row, and electron emission emitter 30 is formed in each of emitter holes $h_3$. Electron emission emitters 30 may be made of a carbon nanotube material.

Cathode layer 12 is interposed between electron emission emitters 30 and substrate 10. First insulating layer 14, gate layer 16, protection layer 18, second insulating layer 24, and focus electrode layer 26 are sequentially formed on cathode layer 12, and have holes on their layers to expose electron emission emitter 30. In the other words, emitter holes $h_3$ are formed as a whole by aligning the holes of first insulating layer 14, gate electrode layer 16, protection layer 18, second insulating layer 24, and focus electrode layer 26, and electron emission emitters 30 are respectively disposed in emitter holes $h_3$.

First and second insulating layers 14 and 24 are made of silicon oxide or silicon nitride, specifically, $SiO_x$ (x<2) or $Si_3N_4$. Gate electrode layer 16, protection layer 18, and focus electrode layer 26 can be made of chromium (Cr), aluminum (Al), molybdenum (Mo), silver (Ag), copper (Cu), gold (Au), or an alloy thereof. Gate electrode layer 16 and protection layer 18 can be made of different materials having different etching selectivity. For example, if gate electrode layer 16 is made of chromium (Cr), protection layer 18 may be made of aluminum (Al), and if gate electrode layer 16 is made of aluminum (Al), protection layer 18 may be made of chromium (Cr). Herein, etching selectivity is defined as ratio of etching rates of one material (or layer) to another material (or layer). In other words, if two materials have different etching selectivity, one material can be etched while another material is not etched in a certain etching condition. If two layers have different etching selectivity, one layer can be etched while another layer is not etched, and therefore another layer could be used as an etching mask for the layer to be etched. The reason that gate electrode layer 16 and protection layer 18 should be made of different materials will be explained in connection with the description of the manufacturing method later.

The operation of the FED illustrated in FIGS. 1 and 2 is described as follows. When a predetermined voltage is applied between cathode layer 12 and gate electrode layer 16, electron beams are emitted from electron emission emitters 30 and exit the emitter holes $h_3$. Focus electrode layer 26 focuses the electron beams. For this purpose, a voltage having the same polarity as the polarity of the electron beams is applied to focus electrode layer 26. The magnitude of the voltage applied to focus electrode layer 26 should be smaller than the magnitude of the voltage applied to gate electrode layer 16. For example, voltages of 0 V, +80 V, and −10 V can be applied to cathode layer 12, gate electrode layer 16, and focus electrode layer 26, respectively.

FIGS. 3 through 13 illustrate a manufacturing steps of a FED constructed as an embodiment of the present invention. In the steps, each layer is formed by a thin layer evaporation method such as a physical vapor deposition (PVD) or chemical vapor deposition (CVD) that is widely used in semiconductor manufacturing processes or FED manufacturing processes, and therefore a description thereof will be skipped.

Figure 3:
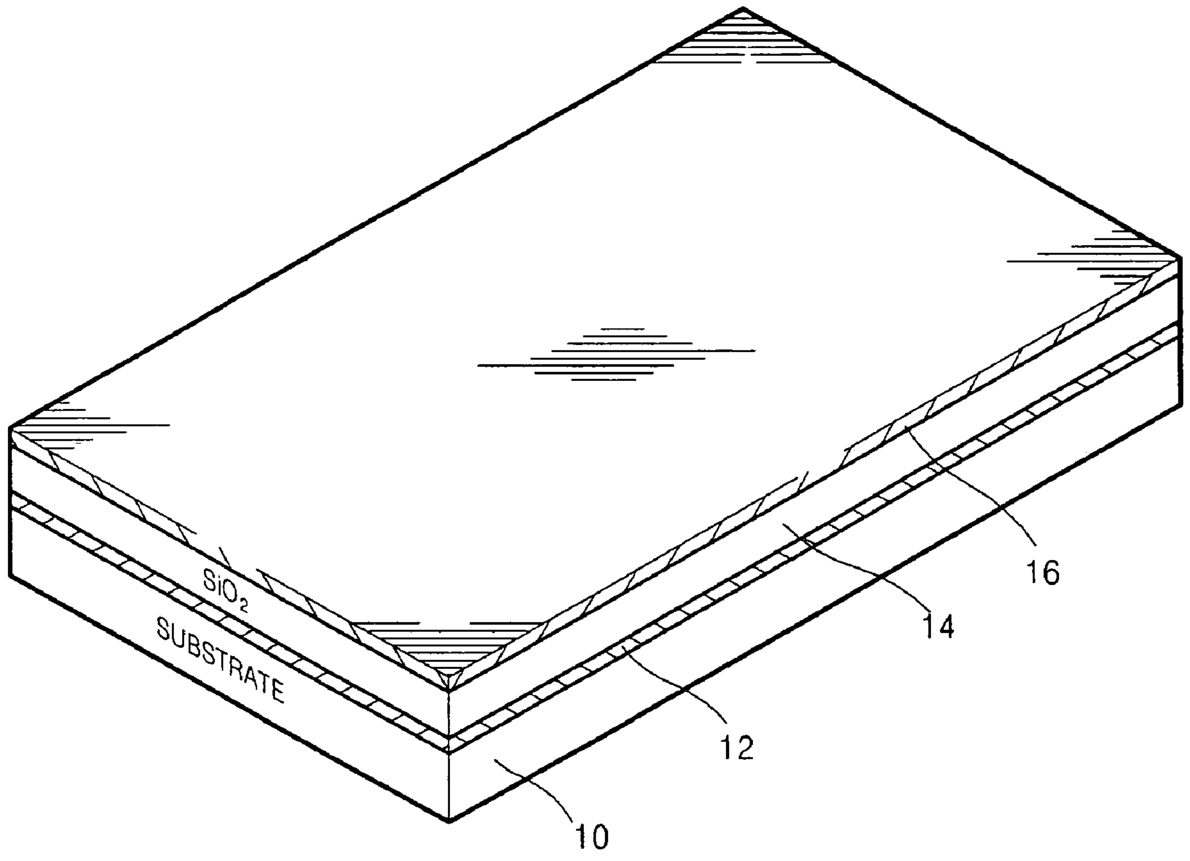
FIGS. 3 through 13 are cross-sectional views illustrating an FED manufacturing steps according to the method of an embodiment of the present invention.
Figure 4:
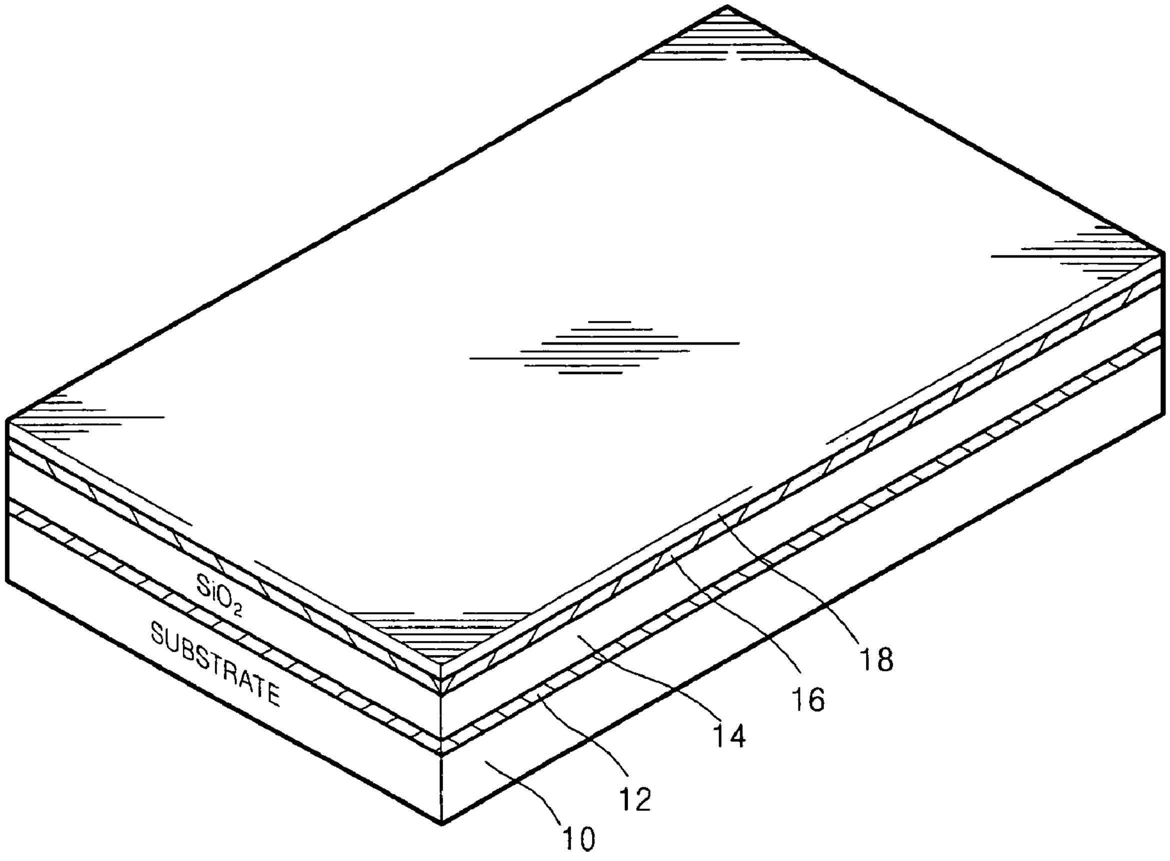

Referring to FIGS. 3 and 4, cathode layer 12, first insulating layer 14, and gate electrode layer 16 are sequentially formed on substrate 10. Next, protection layer 18 is formed on gate electrode layer 16 to cover the top surface of gate electrode layer 16. First insulating layer 14 may be made of silicon oxide or silicon nitride, in detail, $SiO_x$ (x<2) or $Si_3N_4$. Cathode layer 12, gate electrode layer 16, and protection layer 18 may be formed of chromium (Cr), aluminum (Al), molybdenum (Mo), silver (Ag), copper (Cu), gold (Au), or alloys thereof. Gate electrode layer 16 and protection layer 18 may be made of different materials having different wet etching selectivity. This is because gate electrode layer 16 and protection layer 18 are selectively etched and removed in etching processes, which will be described later. For example, if gate electrode layer 16 is made of chromium (Cr), protection layer 18 may be made of aluminum (Al), and if gate electrode layer 16 is made of aluminum (Al), protection layer 18 may be made of chromium (Cr).

Figure 5A:
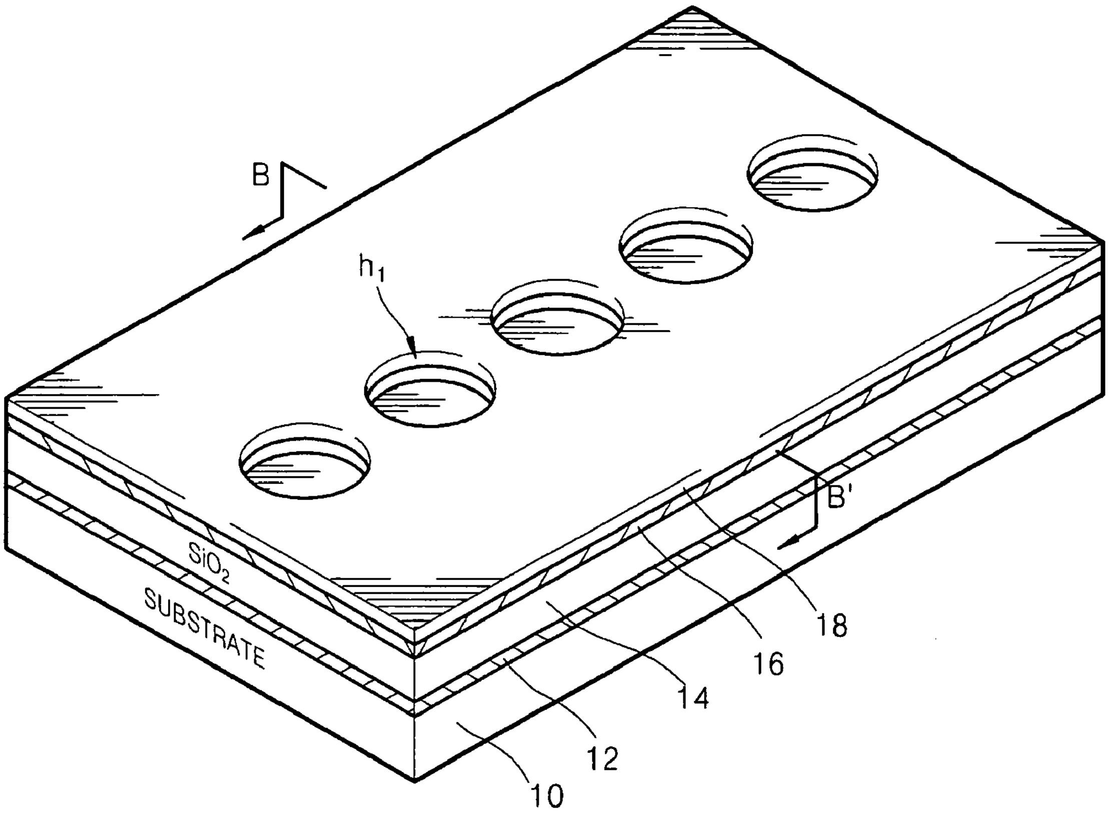
Figure 5B:
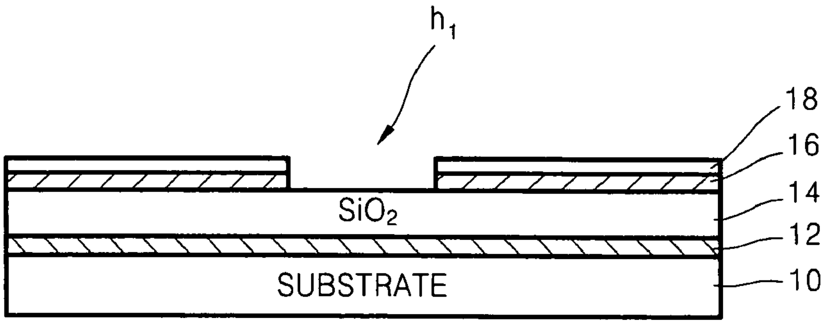

Referring to FIGS. 5A and 5B, a portion of first insulating layer 14 is exposed by sequentially or simultaneously etching a predetermined area of protection layer 18 and gate electrode layer 16. Therefore, a plurality of first opening holes $h_1$, which is arrayed in a row, can be formed. FIG. 5B is a cross-sectional view cut along a line B-B' in FIG. 5A. The diameter of each of first opening holes $h_1$ may be 15 μm or less.

Figure 6:
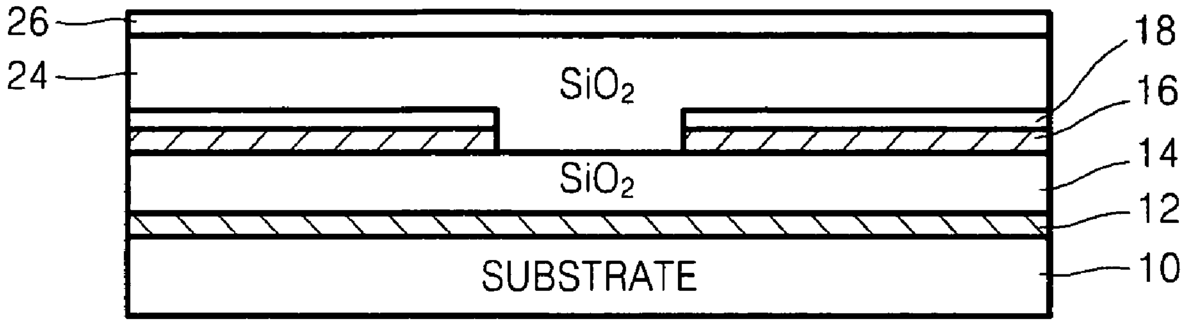

Referring to FIG. 6, second insulating layer 24, which fills first opening holes $h_1$, is formed on protection layer 18. Next, focus electrode layer 26 is formed on second insulating layer 24. Second insulating layer 24 is formed of the same material as the material of first insulating layer 14, which is made of a material such as silicon oxide or silicon nitride, in detail, $SiO_x$ (x<2) or $Si_3N_4$. Because the materials of first insulating layer 14 and second insulating layer 24 are the same, first and second insulating layers can be etched in the same etching process. Focus electrode layer 26 may be made of chromium (Cr), aluminum (Al), molybdenum (Mo), silver (Ag), copper (Cu), gold (Au), or an alloy thereof.

Figure 7A:
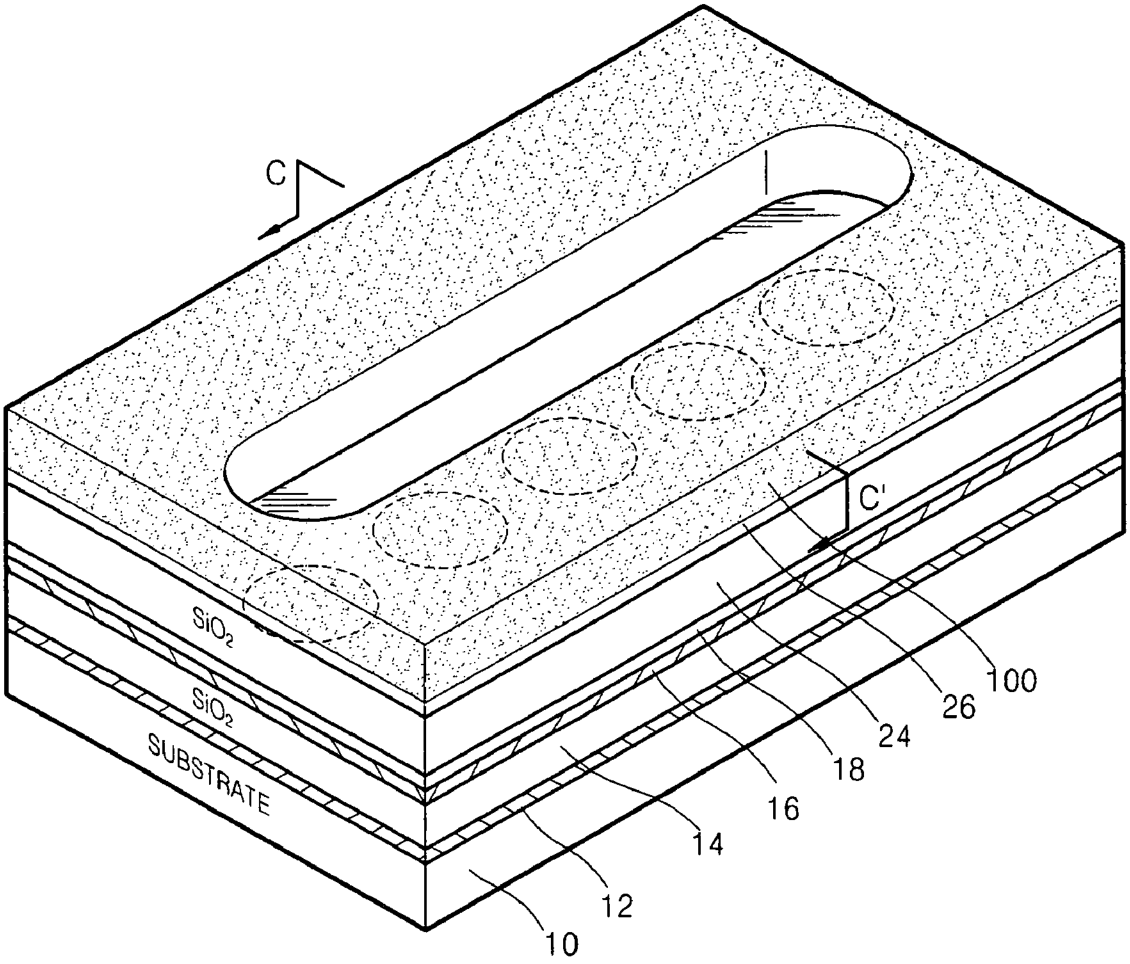
Figure 7B:
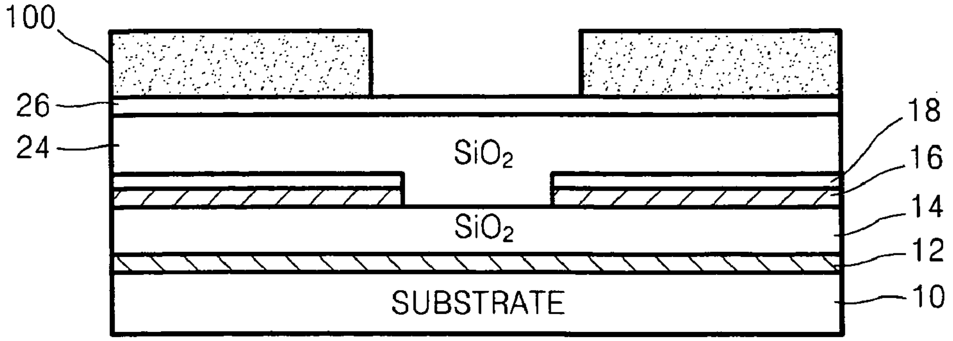

Referring to FIGS. 7A and 7B, photoresist layer 100 is formed on focus electrode layer 26, and then photoresist layer 100 is patterned to make an elongated opening in photoresist layer 100. The elongated opening is formed in a portion of photoresist layer 100 in a manner to cover the array of first opening holes h1 formed under focus electrode layer 26. A portion of focus electrode layer 26 is exposed through the elongated opening of photoresist layer 100. FIG. 7B is a cross-sectional view along a line C-C' of FIG. 7A. In this embodiment, the opening formed in photoresist layer 100 is illustrated as having a elongated shape and covering multiple first opening holes $h_1$, but the shape of the opening of photoresist layer 100 and the number of first opening holes $h_1$ that are covered by the opening of photoresist layer 100 are not limited to those illustrated in this embodiment. For example, the opening could be one-to-one matched to first opening hole $h_1$, or the opening can have a shape such as a square or circle.

Figure 8:
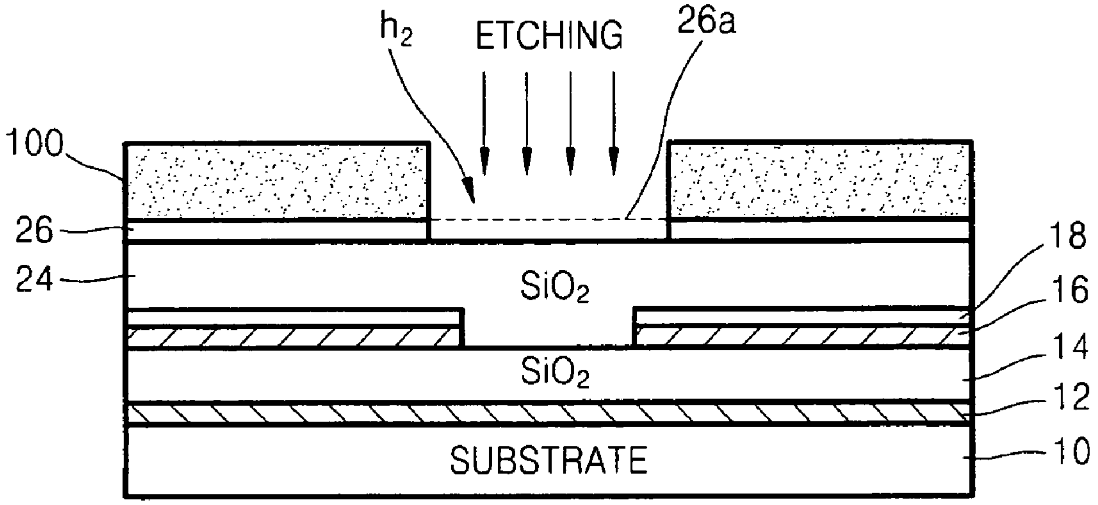
Figure 9:
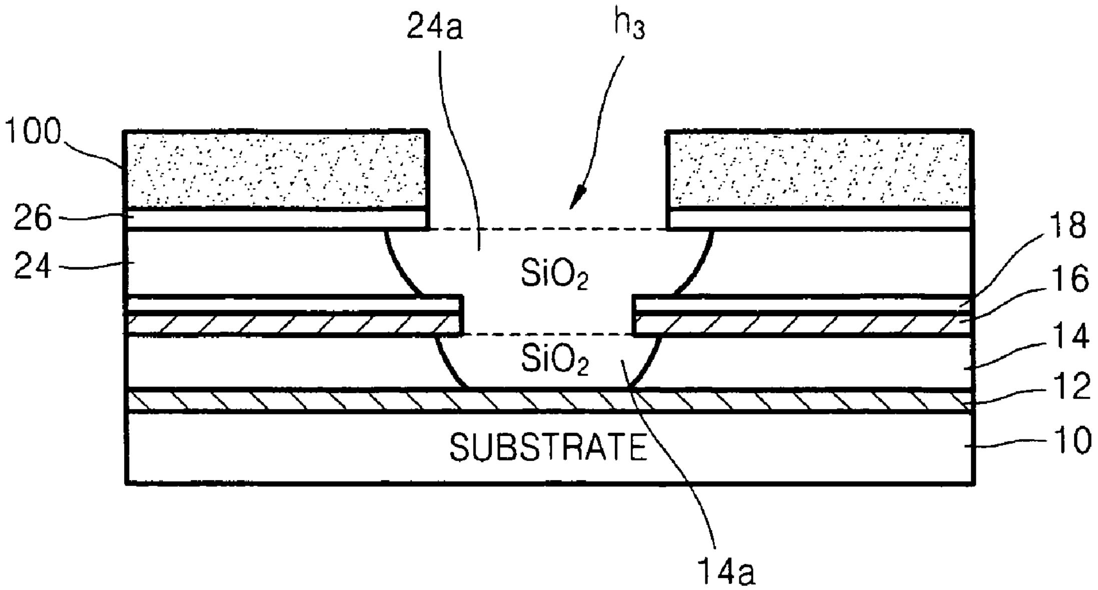

Referring to FIGS. 8 and 9, exposed portion 26*a* of focus electrode layer 26 is etched through the elongated opening, while patterned photoresist layer 100 works as an etching mask. Second opening hole $h_2$, which is aligned to cover the array of first opening holes $h_1$, is formed to expose a portion of second insulating layer 24.

Emitter hole $h_3$, through which a portion of cathode layer 12 is exposed, is formed by etching the exposed portion of the surface of second insulating layer 24, and thereafter by etching the exposed portion of the surface of first insulating layer 14. In detail, portion 24*a* of second insulating layer 24 exposed through second opening hole h2 and portion 14*a* of first insulating layer 14 exposed through first opening hole $h_1$ are removed by an isotropic undercut-etching process that may include a step of injecting an etchant into second opening hole $h_2$. As a result, because second opening hole $h_2$ covers the array of first opening holes $h_1$, a plurality of emitter holes $h_3$, each of which passes through first insulating layer 14, gate electrode layer 16, protection layer 18, second insulating layer 24, and focus electrode layer 26, are formed. Herein, undercut-etching is defined as an etching process that etches a portion of a layer deeply under a cover (or a mask) of the layer. For example, portion 24*a* of second insulating layer 24 and portion 14*a* of first insulating layer 14 of FIG. 9 show undercut-etched shapes. As illustrated in FIG. 9, during the undercut-etching process, a region of portion 24*a* below focus electrode layer 26 is etched and removed, and a region of potion 14*a* below gate electrode layer 16 is etched and removed.

Figure 10:
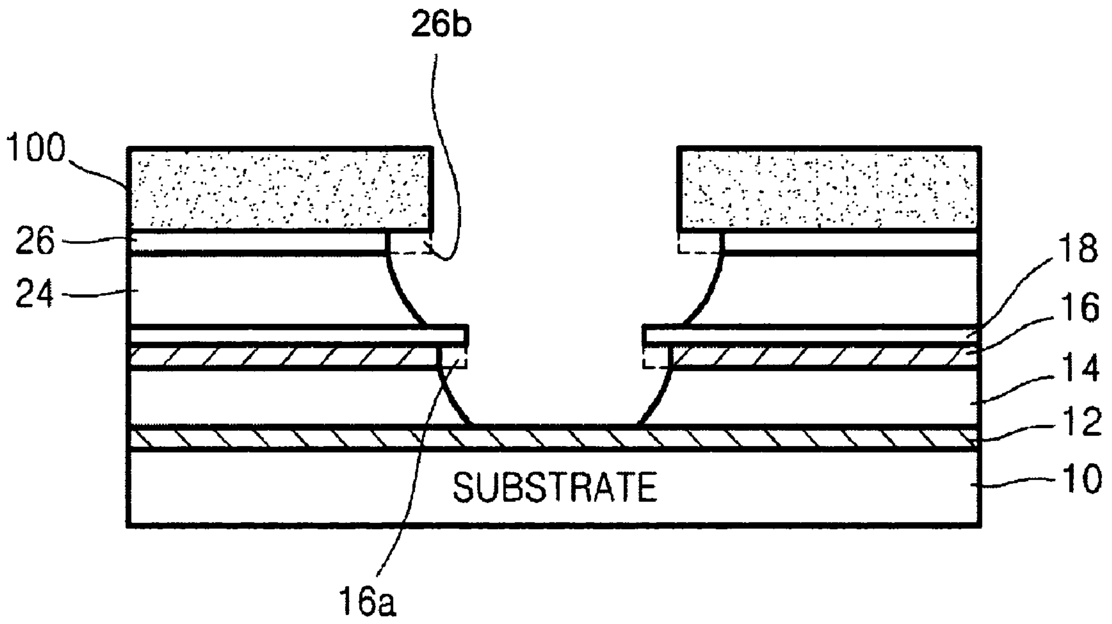
Figure 11:
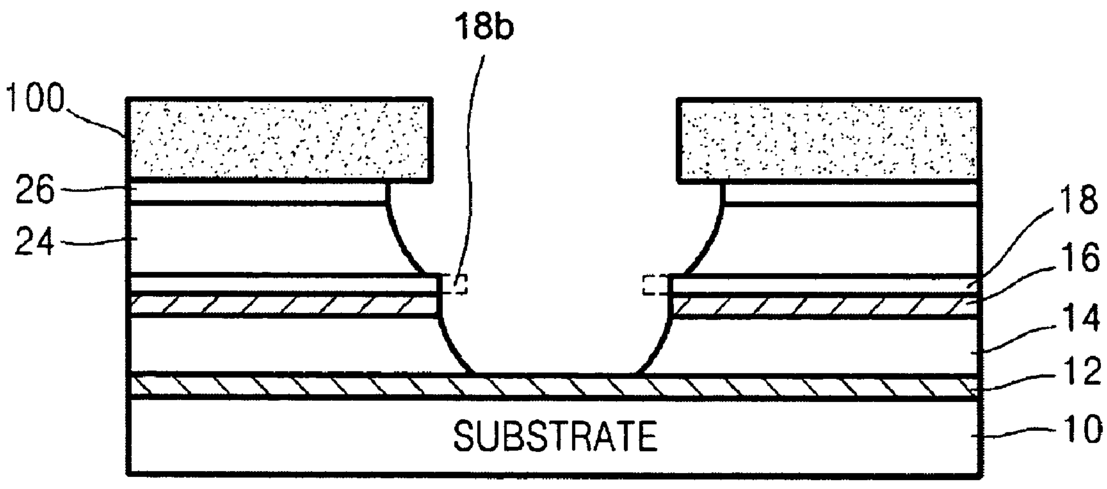

Referring to FIGS. 10 and 11, after emitter holes $h_3$ are formed, protrusion 26*b* of focus electrode 26, protrusion 16*b* of gate electrode layer 16, and protrusion 18*b* of protection layer 18, which protrude into emitter holes $h_3$ as a result of the isotropic undercut etching, are removed to planarize side walls of emitter holes $h_3$. After the planarizing process, which is referred to as the processes of removing protrusions, emitter holes $h_3$ have smooth side walls without any protrusion. Protrusion 26*b* of focus electrode 26, protrusion 16*b* of gate electrode layer 16, and protrusion 18*b* of protection layer 18 can be removed in an another wet etching process. Protrusion 26*b* can be etched and removed, while photoresist layer 100 is used as an etching mask to etch protrusion 26*b* of focus electrode layer 26 that protrudes into emitter hole $h_3$. Also, protection layer 18 is used as an etching mask to etch and remove protrusion 16*b* of gate electrode 16 protruding into the emitter hole $h_3$. The etching process of protrusion 16*b* can be performed after or at the same time as the etching and removing process of protrusion 26*b*.

After the removals of protrusions 26*b* and 16*b*, protrusion 18*b* of protection layer 18 that protrudes into emitter holes $h_3$ is etched and removed. Because protrusion 18*b* of protection layer 18 is used as an etching mask during the etching process of protrusion 16*b* of gate electrode layer 16, protrusion 16*b* of gate electrode layer 16 must be etched first, and then protrusion 18*b* of protection layer 18 must be etched and removed. Particularly, since protection layer 18 is made of a material which can be selectively wet-etched from the material forming gate electrode 16, the protection layer 18 and the gate electrode layer 16 can be selectively and separately etched and removed. Thus, emitter holes $h_3$ having a diameter of 15 μm or less can be formed. The diameter of emitter holes $h_3$ can be in the range of 3 μm to 15 μm. Herein, the diameter of emitter holes $h_3$ is defined as a diameter of a hole formed through first insulating layer 14, gate layer 16, and protection layer 18. Therefore, the diameter of emitter hole $h_3$ can be the same as or slightly larger than the diameter of first opening hole $h_1$ shown in FIG. 5B, because protrusions 16*b* and 18*b* are further removed in the process shown in FIGS. 10 and 11. If a diameter of a hole cannot be exactly determined, for example, if the hole is not cylindrical, the diameter is defined as an average diameter over the hole.

Figure 12:
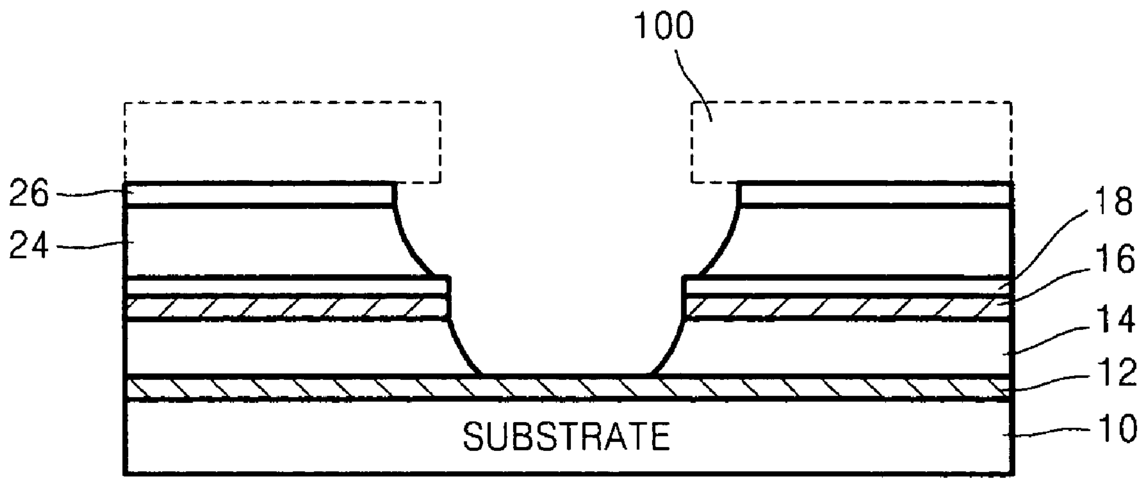
Figure 13:
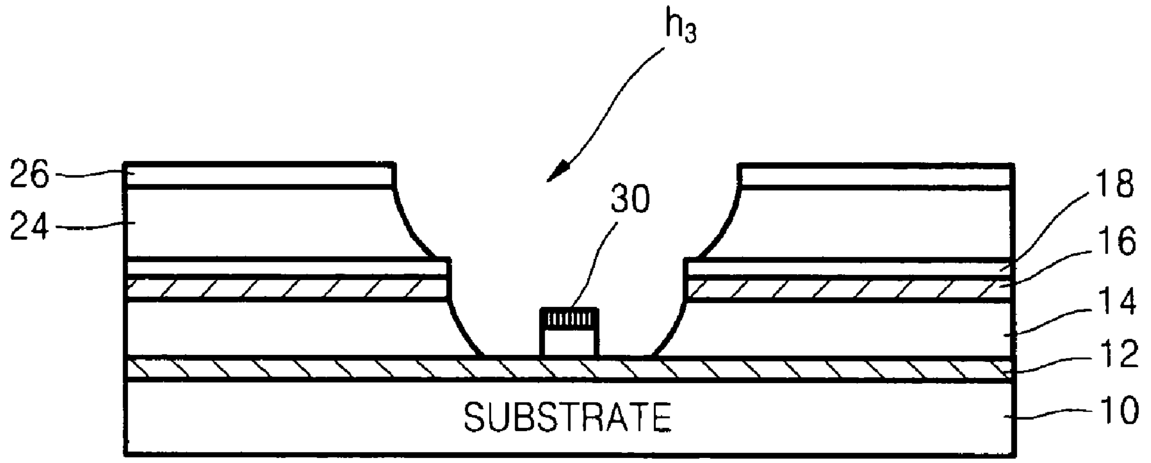

Referring to FIGS. 12 and 13, photoresists layer 100 is removed, and then electron emission emitters 30 are formed on an exposed surface of cathode layer 12 inside emitter holes $h_3$. Electron emission emitters 30 can be formed of a carbon nanotube material. Thus, a FED can be formed.

According to the present invention, a FED with a fine emitter pattern having a uniform size can be obtained. In detail, emitter holes with a diameter of 15 μm or less can be uniformly formed, and the reproducibility and reliability thereof is excellent. According to the present invention, the number of photomask patterning processes can be reduced compared to a conventional manufacturing process, and as the number of the photomask processes is reduced, the emitter holes can be finely made, and are reproducible. As a result, the manufacturing yield of the FEDs can be improved.

While the present invention has been particularly shown and described with reference to exemplary embodiments thereof, it will be understood by those of ordinary skill in the art that various changes in form and details may be made therein without departing from the spirit and scope of the present invention as defined by the following claims. For example, the present invention is not limited to the configuration and the process order as described in the exemplary embodiments described herein.

What is claimed is:

1. A method of manufacturing of a field emission device comprising:

forming a cathode layer on a substrate;

forming a first insulating layer on the cathode layer;

forming a gate electrode layer on the first insulating layer;

forming a protection layer on the gate electrode layer;

etching portions of the protection layer and portions of the gate electrode layer, the etched portions of the protection layer and the gate electrode layer forming a plurality of first opening holes, portions of the first insulating layer being exposed through the first opening holes;

forming a second insulating layer on the protection layer and on the first opening holes, the second insulating layer filling the first opening holes;

forming a focus electrode layer on the second insulating layer;

forming a photoresist layer on the focus electrode layer;

etching a portion of the photoresist layer and a portion of the focus electrode layer to form a second opening hole where both of the etched portion of the photoresist layer and the etched portion of the focus electrode layer covering the first opening holes, a portion of the second insulating layer being undercut through the second opening hole;

undercut etching the exposed portion of the second insulating layer and the portions of the first insulating layer that is exposed through the first opening holes to form emitter holes, portions of the cathode layer being exposed through the emitter holes;

removing the photoresist layer; and forming electron emission emitters on the exposed portions of the cathode layer.

2. The method of claim 1, comprised of the step of etching the exposed portion of the second insulating layer and the portions of the first insulating layer that are exposed through the first opening holes, including a step of:

undercut-etching the exposed portion of the second insulating layer to make protrusions of the focus electrode layer protruding into the emitter holes; and undercut-etching the portions of the first insulating layer that are exposed through the first opening holes to make protrusions of the gate electrode layer protruding into the emitter holes and to make protrusions of the protection layer protruding into the emitter holes.

3. The method of claim 2, further comprising:

removing the protrusions of the focus electrode layer;

removing the protrusions of the gate electrode layer; and removing protrusions of the protection layer.

4. The method of claim 3, wherein the step of removing protrusions of the focus electrode layer and the step of removing protrusions of the gate electrode layer are performed at the same time.

5. The method of claim 3, wherein the step of removing the protrusions of the focus electrode layer includes a step of wet-etching the protrusions of the focus electrode layer, the step of removing the protrusions of the gate electrode layer includes a step of wet-etching the protrusions of the gate electrode layer, and the step of removing the protrusions of the protection layer includes a step of wet-etching the protrusions of the protection layer.

6. The method of claim 1, wherein the gate electrode layer is made of one selected from the group consisting of chromium (Cr), aluminum (Al), molybdenum (Mo), silver (Ag), copper (Cu), gold (Au), and an alloy thereof.

7. The method of claim 1, wherein the protection layer is made of one selected from the group consisting of chromium (Cr), aluminum (Al), molybdenum (Mo), silver (Ag), copper (Cu), gold (Au), and an alloy thereof.

8. The method of claim 1, wherein the focus electrode layer is made of one selected from the group consisting of chromium (Cr), aluminum (Al), molybdenum (Mo), silver (Ag), copper (Cu), gold (Au), and an alloy thereof.

9. The method of claim 1, wherein a material of the gate electrode layer and a material of the protection layer have different etching selectivity.

10. The method of claim 1, wherein the first insulating layer is made of silicon oxide or silicon nitride.

11. The method of claim 10, wherein the silicon oxide includes $SiO_x$ where x is less than 2, and the silicon nitride includes $Si_3N_4$.

12. The method of claim 1, wherein the second insulating layer is made of silicon oxide or silicon nitride.

13. The method of claim 12, wherein the silicon oxide includes $SiO_x$ where x is less than 2, and the silicon nitride includes $Si_3N_4$.

14. The method of claim 1, wherein the electron emission emitter is formed of a carbon nanotube material.

15. The method of claim 1, wherein a diameter of each of the first opening holes is in the range of about 3 micro-meters to about 15 micro-meters.

16. The method of claim 1, comprised of the first opening holes being arrayed in a row.

17. A method of manufacturing of a field emission device comprising:

forming a cathode layer on a substrate;

forming a first insulating layer on the cathode layer;

forming a gate electrode layer on the first insulating layer;

forming a protection layer on the gate electrode layer;

etching both of a portion of the protection layer and a portion of the gate electrode layer to form a first opening hole, a portion of the first insulating layer being exposed through the first opening hole;

forming a second insulating layer on the protection layer and on the first opening hole, the second insulating layer filling the first opening hole;

forming a focus electrode layer on the second insulating layer;

forming a photoresist layer on the focus electrode layer;

patterning both of a portion of the photoresist layer and a portion of the focus electrode layer to form a second opening hole where both of the portion of the photoresist layer and the portion of the focus electrode layer covering the first opening hole, a portion of the second insulating layer being undercut through the second opening hole;

undercut etching both of the portion of the second insulating layer and the portion of the first insulating layer to form an emitter hole, a portion of the cathode layer being exposed through the emitter hole;

removing the photoresist layer; and forming an electron emission emitter on the exposed portion of the cathode layer.

18. A field emission device comprising:

a cathode layer formed on a substrate;

a first insulating layer formed on the cathode layer;

a gate electrode layer formed on the first insulating layer;

a protection layer formed on the gate electrode layer; the stack of the protection layer, the gate electrode layer, and the first insulating layer having a plurality of first opening holes, portions of the cathode layer being exposed through the first opening holes;

a second insulating layer formed on the protection layer;

a focus electrode layer formed on the second insulating layer, the stack of the second insulating layer and the focus electrode layer having a second opening hole that is aligned with the first opening holes in a manner that the exposed portions of the cathode layer are also exposed through the second opening hole; and an electron emission emitter formed the exposed portion of the cathode layer wherein the field emission device is formed by a method of manufacturing comprises of a step of etching an exposed portion of the second insulating layer and portions of the first insulating layer that are exposed through the first opening holes, including steps of:

undercut-etching the exposed portion of the second insulating layer to make protrusions of the focus electrode layer protruding into the emitter holes; and undercut-etching the portions of the first insulating layer that is exposed through the first opening holes to make protrusions of the gate electrode layer protruding into the emitter holes and to make protrusions of the protection layer protruding into the emitter holes.

19. The field emission device of claim 18 wherein is made the first insulating layer of silicon oxide or silicon nitride, wherein the silicon oxide includes $SiO_x$ where x is less than 2, and the silicon nitride includes $Si_3N_4$;

is made the second insulating layer of silicon oxide or silicon nitride, wherein the silicon oxide includes $SiO_x$ where x is less than 2, and the silicon nitride includes $Si_3N_4$;

is formed the electron emission emitter of a carbon nanotube material;

is aligned the first opening holes in a row;

simultaneously removing the protrusions of the focus electrode layer are removed simultaneously and removing the protrusions of the gate electrode layer; and is removed protrusions of the protection layer.

* * * * *